United States Patent [19]

Kawamura et al.

[11] Patent Number: 5,514,966
[45] Date of Patent: May 7, 1996

[54] INSPECTION METHOD AND AN INSPECTION APPARATUS FOR A TEMPORARILY BUNDLED CIRCUIT OF A WIRE HARNESS

[75] Inventors: Tadashi Kawamura; Norio Ohta, both of Yokkaichi, Japan

[73] Assignee: Sumitomo Wiring Systems, Ltd., Japan

[21] Appl. No.: 36,486

[22] Filed: Mar. 24, 1993

[30] Foreign Application Priority Data

Apr. 21, 1992 [JP] Japan .................... 4-129508

[51] Int. Cl.$^6$ .................... G01R 31/08; G01R 19/00
[52] U.S. Cl. .................... 324/539; 324/66
[58] Field of Search .................... 324/539, 540, 324/513, 517, 66

[56] References Cited

U.S. PATENT DOCUMENTS

| | | | |
|---|---|---|---|
| 3,217,244 | 11/1965 | Glover | 324/539 |
| 3,628,133 | 12/1971 | Dornberger | 324/513 |
| 3,917,995 | 11/1975 | Clinton | 324/517 |
| 4,030,029 | 6/1977 | Cox | 324/66 |
| 4,462,155 | 7/1984 | Brunelle et al. | 29/857 |
| 4,477,769 | 10/1984 | Lowery et al. | 324/517 |
| 4,859,953 | 8/1989 | Young et al. | 324/66 |
| 4,928,066 | 5/1990 | Adlon et al. | 328/539 |
| 5,050,093 | 9/1991 | Reddy et al. | 324/513 |

FOREIGN PATENT DOCUMENTS

| | | | |
|---|---|---|---|
| 0541843A | 5/1993 | European Pat. Off. | 324/539 |
| 0685469 | 4/1988 | Japan | 324/539 |
| 0114184 | 4/1990 | Japan | 324/539 |
| 0231579 | 9/1990 | Japan | 324/539 |
| 0215759 | 9/1991 | Japan | 324/539 |
| 1626216 | 2/1991 | U.S.S.R. | 324/539 |
| 0724468 | 2/1955 | United Kingdom | 324/517 |
| 2090987 | 7/1982 | United Kingdom | 324/513 |

*Primary Examiner*—Maura K. Regan
*Attorney, Agent, or Firm*—Jordan B. Bierman; Bierman and Muserlian

[57] ABSTRACT

An inspection method and an inspection apparatus can readily and reliably test a temporarily bundled circuit in which each end of the wires 22A, 22B, 22C, 22D, and 22E is free. A temporary bunling connector 18 is coupled to an inspection connector 19. Each of the wires 22A, 22B, 22C, 22D, and 22E is drawn so that each of the terminals 21 passes between electrodes 11 in a gate electrode unit 5. Each of the indicator lamp 16 on a circuit checker 15 is respectively lit when each of the terminals 21 contacts with each of the electrodes 11 upon passing through the unit 5. The indicator lamp 16 is not lit if there is any fault such as misplacement or breakage of a wire, as there is no electrical communication between the terminal 21 and the electrode 11 in such a case.

12 Claims, 4 Drawing Sheets

5,514,966

INSPECTION METHOD AND AN INSPECTION APPARATUS FOR A TEMPORARILY BUNDLED CIRCUIT OF A WIRE HARNESS

BACKGROUND OF THE INVENTION

1. Field of the Invention

This invention relates to an inspection method and an inspection apparatus for a temporarily bundled circuit of a wire harness to be used in a motor-car, OA equipment, or the like.

2. Statement of the Prior Art

Upon producing a wire harness in which a plurality of wires with terminals at the ends thereof are laid and assembled, the wires are divided into a plurality of groups and each group is piled. The divided groups of wires are temporarily bundled. There are various manners of temporary bundling, such as inserting the opposite ends of each wire into a connector, or inserting one end of each wire into a connector and rendering the other end free. The temporarily bundled circuits are piled and assembled by winding a tape around the piled circuits to form a permanent bundling.

If an inspection finds a fault such as misplacement or breakage of a wire in a circuit subject to a regular bundling process, it is necessary to unwind the tape and return the regularly bundled circuit to the temporarily bundled circuit. This process requires considerable labor and lowers production efficiency.

Accordingly, it is a general method to inspect a circuit subject to temporary bundling. In a temporarily bundled circuit in which each of the wires is inserted into and coupled to a connector at the opposite ends thereof, an electrical device such as a checker or the like inspects misplacement, breakage of the wires, or the like in the connector.

For convenience of explanation, an example of conventional temporary bundling will be explained below by referring to FIG. 6. FIG. 6 is a perspective view of a temporarily bundled circuit of wires. As shown in FIG. 6, a temporarily bundled circuit 100 has wires 101 with one end free and the other end coupled to a connector. Each wire may be different in length. Accordingly, it is necessary to manually inspect a circuit by contacting a terminal 102 of each wire 101 with an electrode of an inspection device or to visually inspect every wire in the circuit by referring to a sample or a layout table.

In a temporarily bundled circuit in which both ends of each wire are inserted into and coupled to a connector, an electrical device such as a checker or the like can easily and reliably effect the inspection. However, as shown in FIG. 6, in a temporarily bundled circuit 100 in which one end of each wire 101 is free, the inspection method in which the terminals 102 of the wires 101 are manually contacted with the electrode of the inspection device requires much labor and reduces efficiency of production. The visual inspection method of using the sample and an arrangement table cannot detect breakage of the wires and renders products unreliable.

SUMMARY OF THE INVENTION

A first object of the present invention is to provide an inspection method which can readily and reliably test a temporarily bundled circuit of a wire harness in which each end of the wires is free.

A second object of the present invention is to provide an inspection apparatus which can readily and reliably test a temporarily bundled circuit of a wire harness in which each end of the wires is free.

In order to achieve the first object, an inspection method in accordance with the present invention is applied to a temporarily bundled circuit of a wire harness in which one end of each wire is connected to a connector and the other end is provided with a terminal. In the inspection method, the connector is detachably coupled to an inspection connector. Each of the terminals connected to each of the wires is passed through a gate electrode unit connected through a detector to the inspection connector. The detector senses each electrical communication caused by each contact between each of the terminals and the gate electrode unit when the terminals pass through the unit.

In order to achieve the second object, an inspection apparatus in accordance with the present invention is applied to a temporarily bundled circuit of a wire harness in which one end of each wire is connected to a connector and the other end is provided with a terminal. The inspection apparatus comprises:

a plurality of wire-receiving units for receiving the wires in distribution;

a plurality of gate electrode units provided at one end of each of the wire-receiving units and adapted to pass each of the terminals on the wires while contacting with the wire-receiving units;

an inspection connector detachably couple to the connector on the wires; and a detector for connecting the inspection connector to each of the gate electrode units to sense each electrical communication between the inspection connector and each of the gate electrode units.

According to the method and apparatus of the present invention, each of the wires held in each wire-receiving unit is inserted into and coupled to the connector at the end of each wire-receiving unit. Thus, a temporarily bundled circuit with the other ends of the wires being free is formed.

After the connector is coupled to the inspection connector, a terminal is passed through a gate electrode unit by drawing each wire. When each terminal passes through the gate electrode unit, the terminal contacts with the gate electrode unit. When the inspection connector is electrically communicated with each of the gate electrode units through the temporarily bundled wires, the detector senses this communication and thus confirms that the wires are not broken or misplaced. On the other hand, if there is any misplacement or breakage in the temporarily bundled circuit, the inspection connector is not electrically communicated with the affected gate electrode unit through the temporarily bundled wires, even if each terminal contacts with the gate electrode unit. Thus, the detector does not sense any communication and confirms that there is misplacement or breakage in the wires.

DETAILED DESCRIPTION OF THE PREFERRED EMBODIMENTS

Figure 1:
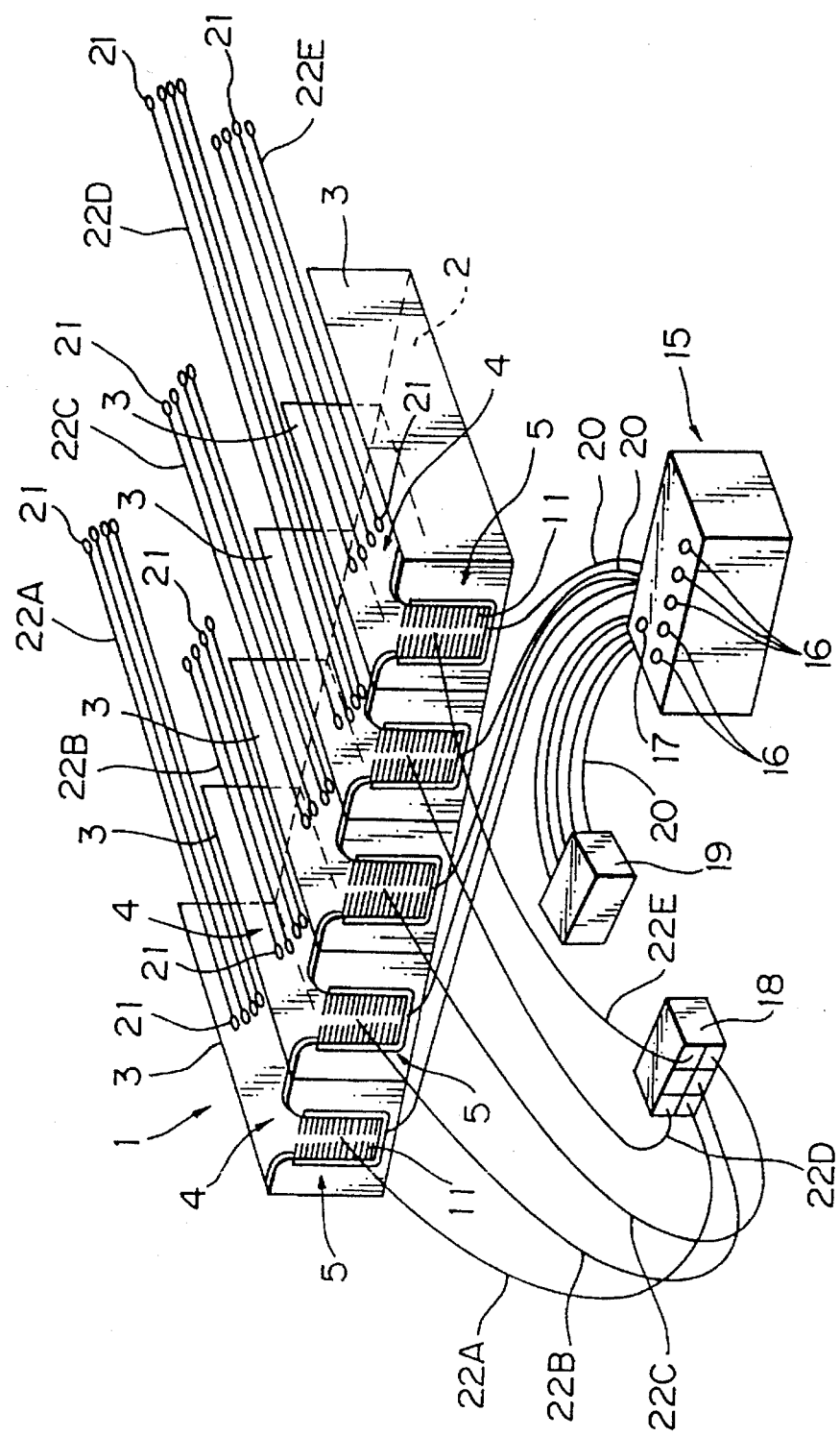
FIG. 1 is a schematic perspective view of a first embodiment of an inspection apparatus of the present invention.

A first embodiments of the method and apparatus in accordance with the present invention will be explained below by referring to the drawings. In FIG. 1, a receiving case 1 made of a synthetic resin or the like comprises a base plate portion 2 with a rectangular shape in a plan view and a plurality of partitions 3 projected at a given spaced distance on the base plate portion 2. Grooved wire-receiving units 4 are formed between the partitions 3. The wire-receiving unit 4 is open at one end and is provided with a gate electrode unit 5 at the other end.

Figure 2:
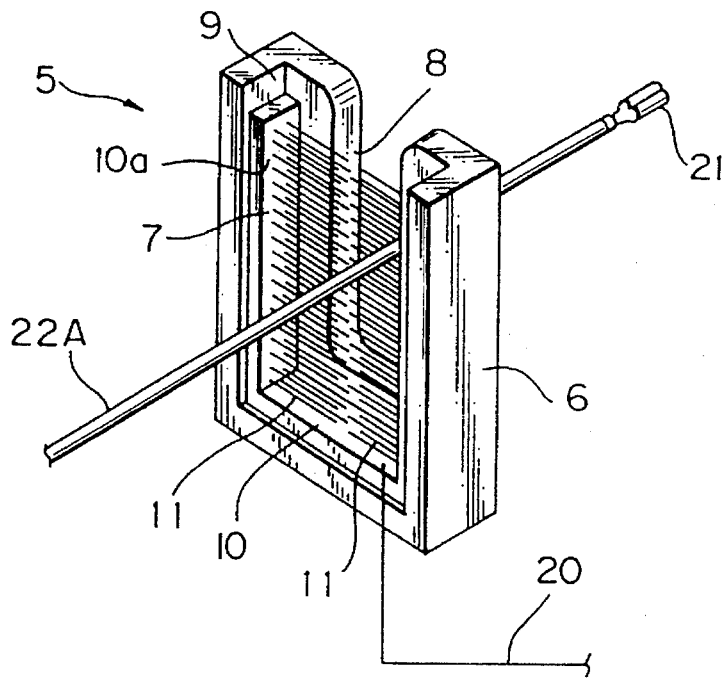
FIG. 2 is an enlarged view of a main part in FIG. 1.

Each of the gate electrode units 5, as shown in FIG. 2, includes an electrode supporter 6 made of an insulation material such as a synthetic resin or the like, and an electrode assembly 7. The electrode supporter 6 is provided with a wire-guide slot 8 extending vertically from the top toward the bottom thereof and with a recess 9 for mounting the electrode assembly 7.

The electrode assembly 7 includes an electrode body 10 made of a U-shaped metal piece and brush electrodes 11 planted on the opposite stand walls 10a of the electrode body 10. Each of the brush electrodes 11 projects horizontally by substantially the same length from the stand wall 10a so that each free end is arranged adjacent to each other. When the electrode assembly 7 is mounted on the recess 9 of the electrode supporter 6, a clearance between the opposite brush electrodes 11 is substantially disposed in the center of the wire-guide slot 8.

The electrode supporters 6 of the gate electrode units 5 are attached to the other ends of the respective wire-receiving unit 4.

In FIG. 1, a circuit checker or detector 15 includes a plurality of indication lamps 16 and a reset switch 17. Each of the terminals in an inspection connector 19 which is detachably coupled to a connector 18 to be tested is electrically connected through the circuit checker 15 and leads 20 to the electrode body 10 of the corresponding gate electrode unit 5. When the terminals in the inspection connector 19 are electrically communicated with the brush electrodes 11 through the temporarily bundled circuits of the wire harnessed, the corresponding indicator lamp 16 on the circuit checker 15 is lit. The lit lamp 16 is self-held and released by the reset switch 17.

The inspection apparatus for the temporarily bundled circuit of the wire harness comprises the receiving case 1, the gate electrode units 5, the circuit checker 15, and the inspection connector 19.

The first embodiment of the inspection method which uses the first embodiment of the inspection apparatus described above will be explained below. Wires 22A, 22B, 22C, 22D, and 22E are cut in given lengths, are provided with terminals at both ends, and are disposed in distribution in the respective wire-receiving units 4. Each of the wires 22A, 22B, 22C, 22D, and 22E is drawn from each of the wire-receiving units 4 so that each of the terminals 21 on one end of the wires is inserted into and coupled to a given coupling point in the connector 18. Thus, the temporarily bundled circuit is formed in which one end of each of the wires 22A, 22B, 22C, 22D, and 22E is coupled to the connector 18 and the other end is free. The terminals 21 on other ends of the wires 22A, 22B, 22C, 22D, and 22E are disposed in the wire-receiving units 4 while intermediate portions of the wires 22A, 22B, 22C, 22D, and 22E are disposed in the wire-guide slots 8 and between the brush electrodes 11.

Then, the connector 18 is coupled to the inspection connector 19 and the circuit checker 15 is turned on. The wires 22A, 22B, 22C, 22D, and 22E are drawn forward so that the terminals 21 on the other ends of the wires 22A, 22B, 22C, 22D, and 22E pass between the brush electrodes 11. During passing, each terminal 21 contacts with each brush electrode 11 and the inspection connector 19 is electrically communicated with the brush electrodes 11 through the temporarily bundled wires 22A to 22E. The circuit checker 15 senses this communication and lights the corresponding indication lamp 16. It is possible by the lit lamp to confirms that there is neither breakage nor misplacement in the temporarily bundled wires.

On the other hand, if there is any mlsplacement or breakage in the temporarily bundled wires, the inspection connector 19 is not electrically communicated with the brush electrodes 11 through the temporarily bundled wires 22A, 22B, 22C, 22D, or 22E, even if the terminals contact with the brush electrodes 11, and thus the lamp 16 connected to an abnormal wire 22A, 22B, 22C, 22D, or 22E is not lit. Consequently, it is possible to confirm whether the wires 22A to 22E are misplaced or broken.

After the inspection of the temporarily bundled circuit is finished, the reset switch 17 is released and the above processes can be repeated.

Inspection of the temporarily bundled circuit can be easily effected merely by drawing the wires 22A to 22E through the gate electrode units 5 from the wire-receiving units 4. Since this inspection can be effected electrically as opposed to visually, the inspection is highly reliable.

The wires 22A to 22E may be drawn individually or simulataneously.

Figure 3:
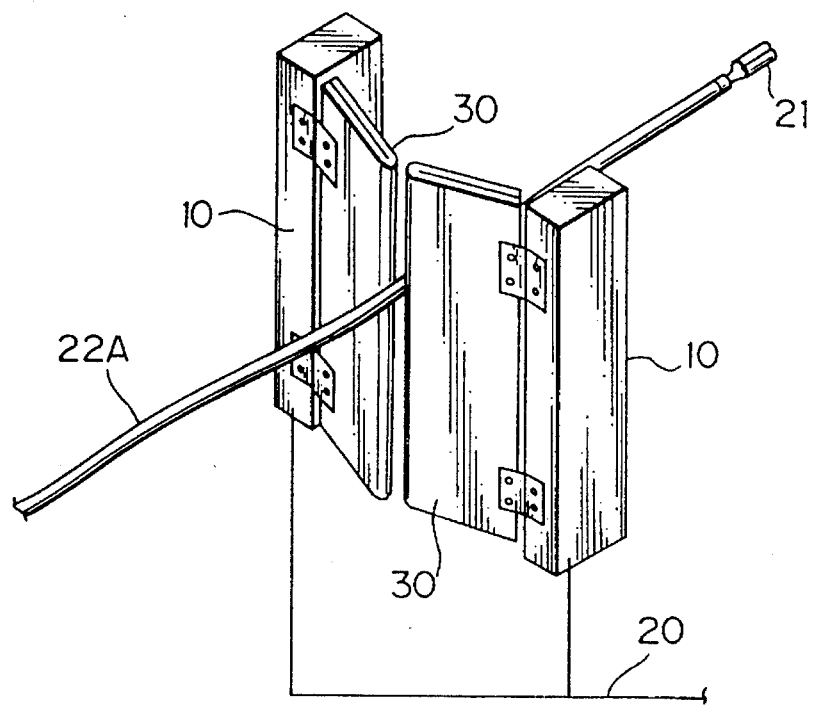
FIG. 3 is a perspective view of a main part in a second embodiment of the inspection apparatus of the present invention.

FIG. 3 shows a second embodiment of the inspection apparatus of the present invention. Door-like electrodes 30 may be substituted for the brush electrodes 11. The door-like electrodes 30 are biased by springs (not shown) so that they can close an opening for passing the wires 22A to 22E. The door-like electrodes 30 are connected through the electrode body 10 to the circuit checker 15.

Figure 4:
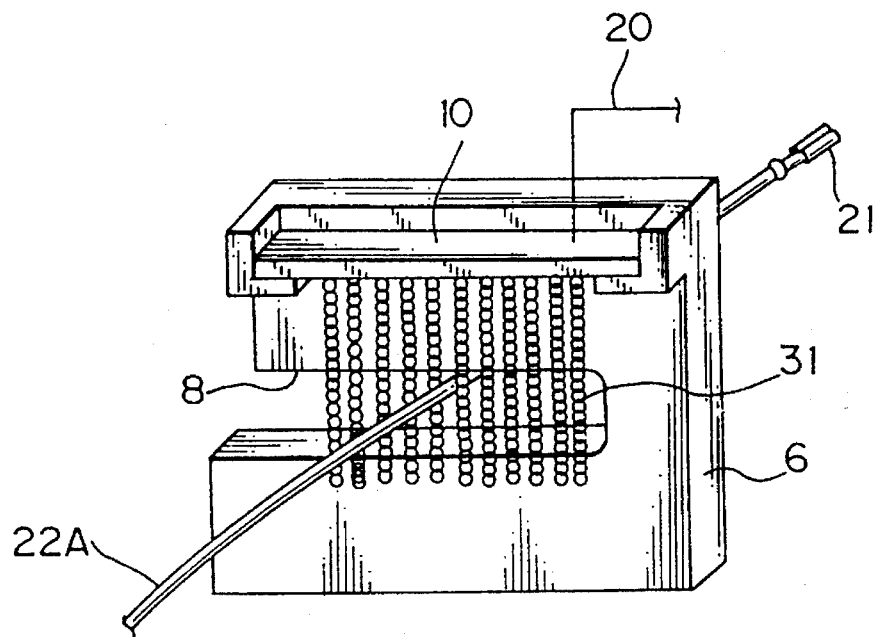
FIG. 4 is a perspective view of a main part in a third embodiment of the inspection apparatus of the present invention.

FIG. 4 shows a third embodiment of the inspection apparatus of the present invention. Rope curtain-like electrodes 31 may be substituted for the brush electrodes 11. The guide slots 8 in the electrode supporter 6 extend horizontally at the height in opposition to the electrodes 31. The electrodes 31 are electrically connected to the circuit checker 15 through the electrode body 10.

Figure 5:
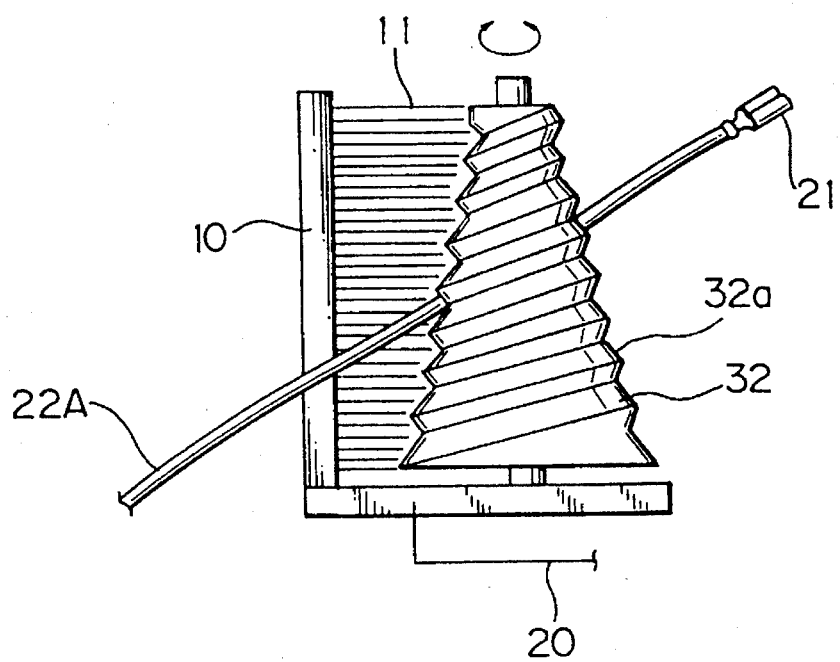
FIG. 5 is a perspective view of a main part in a fourth embodiment of the inspection apparatus of the present invention.
Figure 6:
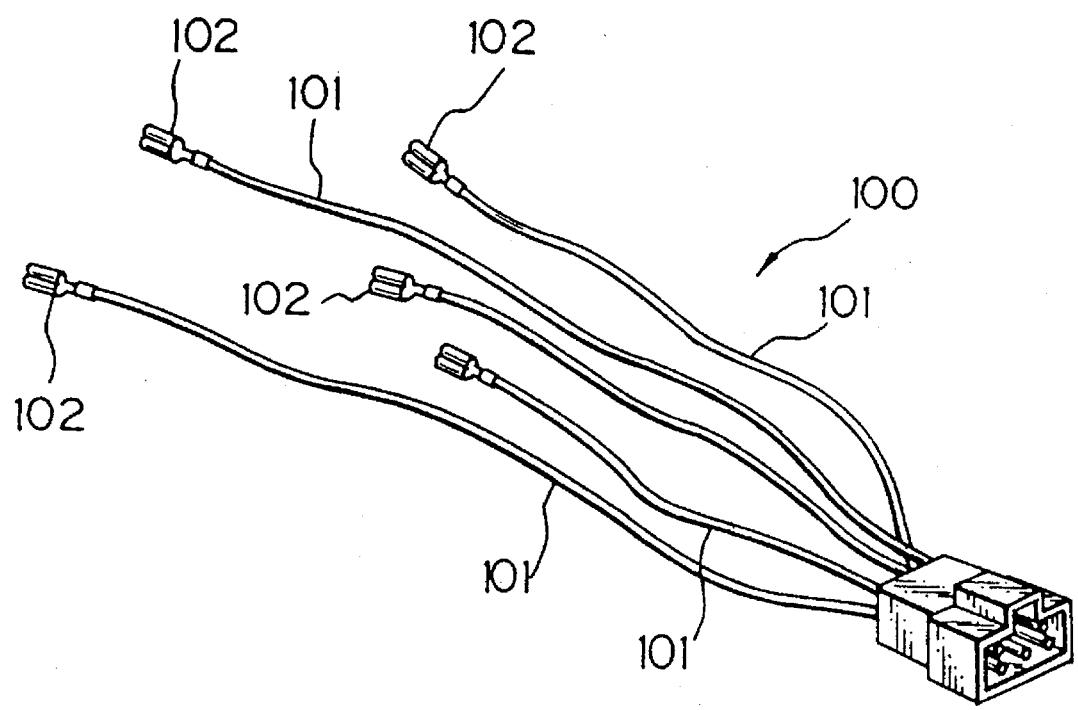
FIG. 6 is a perspective view illustrating an example of a temporary bundling of wires.

FIG. 5 shows a fourth embodiment of the inspection apparatus of the present invention. A cone roller electrode 32 may be substituted for the brush electrodes 11. The roller electrode 32 is rotatable about a vertical axis. The cone roller 32 is provided with guide grooves 32a on the outer periphery. The brush electrodes 11 and the cone roller electrode 32 are electrically connected to the circuit checker 15 through the electrode body 10. Since the roller electrode 32 is formed into a cone shape, it is possible to make a contact area between the terminal 21 and the roller electrode 32 when passing the terminals 21. Further, the guide grooves 32a can prevent the wires 22A to 22E from slipping out or falling down from the roller electrode 32. The roller electrode 32 may be made of a non-conductive material.

Although five wire-receiving units 4 are juxtaposed in the receiving case 1 in the above embodiments, the number of wire-receiving units 4 may be determined in accordance with the number of wires 22A, 22B, 22C, 22D, and 22E, . . . Further, although the inspection connector 19 is separated from the circuit checker 15 in the above embodiments, the connector 19 may be formed integrally with the checker 15.

According to the inspection method and apparatus for the temporarily bundled circuit of the wire harness of the present invention, it is possible for the detector to easily inspect whether the temporarily bundled circuit is normal or not merely by drawing the temporarily bundled wires at the free ends so that the terminals contact with the gate electrode units. This electrical inspection can improve reliability of inspection.

What is claimed is:

1. In an inspection method for a temporarily bundled circuit of a wire harness in which each wire is connected to a connector at one end and is provided with a terminal at the other end, said inspection method for the temporarily bundled circuit of the wire harness is characterized in that:

said connector is detachably coupled to an inspection connector;

each of said terminals connected to each of said wires is passed through a gate electrode unit connected through a detector to said inspection connector; and said detector senses each electrical communication caused by each contact between each of said terminals and said gate electrode unit when said terminals pass through said unit.

2. An inspection apparatus for at least one temporarily bundled plurality of wires wherein each of said wires is connected to a wire connector at one end and is provided with a terminal at its other end, said inspection apparatus comprising at least one wire-receiving unit for receiving said wires;

a gate electrode at one end of each said wire-receiving unit through which said wire is adapted to pass, each said terminal on said wires adapted to contact said gate electrode as each of said wires is withdrawn from said wire-receiving unit in a downstream direction;

an inspection connector detachably coupled to said wire connector; and a detector electrically connecting said inspection connector to each said gate electrode to sense each electrical communication between said inspection connector and each said gate electrode.

3. The apparatus of claim 2 wherein said gate electrode comprises a U-shaped electrode assembly having a base from which a first wall and, spaced horizontally apart from said first wall, a second wall perpendicularly extend, a first plurality of brush electrodes substantially parallel to said base extending from an inner surface of said first wall toward said second wall, a second plurality of brush electrodes substantially parallel to said base extending from an inner surface of said second wall toward said first wall, there being a gap between ends of said first plurality and ends of said second plurality.

4. The apparatus of claim 2 wherein said gate electrode comprises a first support and, spaced apart therefrom, a second support substantially parallel to said first support, a first electrode door adapted for swinging movement about a first axis parallel to said first support and swingably mounted thereon, a second door electrode adapted for swinging movement about a second axis parallel to said second support and swingably mounted thereon, said first electrode and said second electrode each having a closed position, wherein said first and second electrodes are substantially perpendicular to said withdrawal direction, and at least one open position wherein said first and second electrodes are at an angle to said withdrawal direction other than 90°.

5. The apparatus of claim 4 wherein said first door and second second door are biased toward said closed position.

6. The apparatus of claim 2 wherein said gate electrode comprises a guide slot adapted to permit said wires to pass therethrough in said withdrawal direction, a plurality of rope-like, flexible, horizontally spaced apart curtain electrodes adjacent said guide slot, each said curtain electrode spaced apart from its adjacent curtain electrodes by a distance such that, as said wires are withdrawn, said terminals contact at least one of said electrodes.

7. The apparatus of claim 6 wherein said curtain electrodes are in said downstream direction from said guide slot.

8. The apparatus of claim 2 wherein said gate electrode comprises a base, a wall extending from said base, a plurality of brush electrodes substantially parallel to each other extending from an inner surface of said wall, thereby defining a plane, a cone extending from said base in a tapering direction and having its axis substantially parallel to said plane, said cone being adjacent said brush electrodes and rotatable about said axis.

9. The apparatus of claim 8 wherein said cone is provided with grooves on its surface, said grooves adapted to permit said wires and said terminals to pass therethrough.

10. The apparatus of claim 8 wherein said cone is non-conductive.

11. The apparatus of claim 8 wherein said cone is conductive and said terminals contact said cone while passing therethrough.

12. An inspection method for a temporarily bundled circuit of a wire harness in which each wire is connected to a connector at one end and is provided with a terminal at the other end, said inspection method comprising detachably coupling said connector to an inspection connector;

connecting each of said terminals to each of said wires and passing said wires through a gate electrode unit which is connected through a detector to said inspection connector; and sensing each electrical communication caused by each contact between each of said terminals and said gate electrode unit when said terminals pass through said unit.

* * * * *